(12) United States Patent
Nakai et al.

(10) Patent No.: US 7,536,659 B2
(45) Date of Patent: May 19, 2009

(54) SEMICONDUCTOR MEMORY DEVICE AND SEMICONDUCTOR DEVICE

(75) Inventors: Nobuyuki Nakai, Osaka (JP); Yuji Yamasaki, Osaka (JP)

(73) Assignee: Panasonic Corporation, Osaka (JP)

( * ) Notice: Subject to any disclaimer, the term of this patent is extended or adjusted under 35 U.S.C. 154(b) by 292 days.

(21) Appl. No.: 11/683,121

(22) Filed: Mar. 7, 2007

(65) Prior Publication Data

US 2007/0214444 A1 Sep. 13, 2007

(30) Foreign Application Priority Data

Mar. 9, 2006 (JP) ............................. 2006-063835

(51) Int. Cl.
*G06F 17/50* (2006.01)
(52) U.S. Cl. ...................... 716/1; 716/6; 716/9; 716/18
(58) Field of Classification Search .................. 716/1, 716/6, 9, 18; 711/2
See application file for complete search history.

(56) References Cited

U.S. PATENT DOCUMENTS

| 7,058,863 | B2 | 6/2006 | Kouchi et al. |
| 7,076,745 | B2 | 7/2006 | Togo |
| 2003/0208738 | A1 | 11/2003 | Hsu et al. |
| 2005/0108459 | A1* | 5/2005 | Pochmuller ............... 711/2 |

FOREIGN PATENT DOCUMENTS

JP 2002324395 11/2002

* cited by examiner

*Primary Examiner*—Thuan Do
(74) *Attorney, Agent, or Firm*—Dickinson Wright, PLLC

(57) ABSTRACT

Decreases in area efficiency and wiring efficiency and degradation in performance are prevented which result from imbalances in dimensional ratios between miniaturized control circuits and other components brought by the development of microfabrication process such as a process of fabricating large-capacity DRAMs as hard macros. A memory array region and a control region are placed such that the two regions are in contact with each other and have a convex shape when viewed from above. Because of this, the layout areas of memories such as large-capacity DRAMs are optimized and their production cost can be reduced. That is, by taking note that the fact that large-capacity DRAMs are in a quadrilateral shape is not an essential condition for the ease of their placement because large-scale DRAMs have the disadvantages that the number of the DRAMs provided in semiconductor devices is limited and the ratio of the areas of the DRAMs to that of the semiconductor devices is high unlike ROMs and SRAMs required to come in various sizes, a large-capacity DRAM can be not only fabricated with its area efficiency and wiring efficiency optimized but provided as a hard macro having a configuration easily laid out in terms of the implementation of a system LSI.

33 Claims, 11 Drawing Sheets

SEMICONDUCTOR MEMORY DEVICE AND SEMICONDUCTOR DEVICE

BACKGROUND OF THE INVENTION

1. Field of the Invention

The present invention relates to a semiconductor memory device and a semiconductor device. More particularly, the invention relates to a layout geometry of a semiconductor memory device which contributes to improvements in the performance and wiring efficiency of the semiconductor memory device serving as a hard macro and to ease of connections with peripheral circuits.

2. Description of the Related Art

In the field of the manufacture of semiconductor devices, their high degree of integration resulting from the advance of microfabrication technology has been recently accelerating more and more together with competition among semiconductor manufacturers. Among them, system LSIs fabricated by providing a large-capacity memory on individual chips together with a microprocessor, an ASIC, a custom logic, or the like are a product line on which the manufacturers focus their efforts as a key device which allows them to offer a high added value which decides the performance and differentiation of products to which the LSIs are mounted.

Since it is said that memories classified as ROMs and SRAMs are also required to come in various sizes as hard macros in terms of the design of these semiconductor devices called system LSIs and since it is easy to place those memories in combination in the regions of logic circuits in terms of their layout design, those memories are required to have quadrilateral shapes as a de facto basic specification.

In the mounting of large-capacity DRAMs as well, they have been required to have the shape of such a quadrilateral as a basic specification. Therefore the configuration of a basic circuit of a semiconductor device including a DRAM will be described below with reference to FIG. 9.

In FIG. 9, reference numeral 101 denotes a memory cell region in which memory cells are arranged in the form of a matrix, reference numeral 102 denotes a row decoder circuit which selectively points to a row in the memory cell region 101, reference numeral 103 denotes a column decoder circuit which selectively points to a column in the memory cell region 101, reference numeral 104 denotes a sense read/write amplifier circuit which reads and writes data from and to memory cells selectively pointed to by the row decoder circuit 102 and the column decoder circuit 103, reference numeral 105 denotes an internal data input/output line, reference numeral 106 denotes an external data input/output line, reference numeral 107 denotes a data input/output circuit which inputs and outputs data from and to the sense read/write amplifier circuit 104, reference numeral 108 denotes a row address, reference numeral 109 denotes a column address, and reference numeral 110 denotes an address control signal.

Reference numeral 111 denotes an address input circuit which selectively outputs a row address 108 specifying a row to the row decoder circuit 102 and a column address 109 specifying a column to the column decoder circuit 103 according to an address control signal 110; reference numeral 112 denotes an external control signal; reference numeral 113 denotes a control circuit which sends out an address control signal 110 according to an external control signal 112; reference numeral 114 denotes an internal address control signal; reference numeral 115 denotes a refresh circuit which produces an internal address control signal 114 equivalent to an address control signal 110 during standby to effect the refresh operation of the memory cell region 101; reference numerals 116's denote timing adjustment signals; reference numeral 117 denotes a timing generator circuit which adjusts the timings of the operations of the address input circuit 111, the control circuit 113, and the refresh circuit 115 by sending timing adjustment signals 116's; reference numerals 118's denote internal synchronization clock signals; reference numeral 119 denotes a clock generator circuit which synchronizes the data input/output circuit 107, the address input circuit 111, the control circuit 113, the refresh circuit 115, and the timing generator circuit 117 by sending internal synchronization clock signals 118's; and reference numeral 120 denotes an external clock signal.

Reference numeral 121 denotes a memory array region comprised of the components 101 to 107, reference numeral 122 denotes a control region comprised of the components 108 to 120, reference numeral 123 denotes a semiconductor memory device comprised of the memory array region 121 and the control region 122 as the component circuit according to the invention, reference numerals 124's denote large-scale logic circuit regions comprised of standard cells, reference numeral 125 denotes a redundancy saving address storage unit, reference numeral 126 denotes a redundancy saving address line which connects the redundancy saving address storage units 125 and the memory array region 121, reference numerals 127's denote external terminals connected to the semiconductor memory device 123 and the large-scale logic circuit regions 124's, and reference numeral 128 denotes the semiconductor device comprised of the semiconductor memory device 123, the large-scale logic circuit regions 124's, the redundancy saving address storage unit 125, and the external terminals 127's.

Since the present invention is directed to the configuration of the above semiconductor memory device, detailed descriptions about the operations of the circuits of FIG. 9 will be omitted.

FIG. 10 is an explanatory drawing of a conventional configuration of the semiconductor memory device 123 shown in FIG. 9. In FIG. 10, reference numeral 201 corresponds with the memory array region 121, reference numeral 202 corresponds with the control region 122, reference numerals 203's correspond with the data lines 106's, and reference numeral 204 corresponds with the external control signal 112 and the external clock signal 120.

Since the control region 202 is placed so as to become equal in length to the memory array region 201, the control region 202 has a high aspect ratio (see JP-A No. 2002-324395).

However, in a case where large-capacity DRAMs are made as hard macros while meeting such a basic specification, imbalances in dimensional ratios between components have become pronounced as control circuits have been miniaturized due to advanced microfabrication process.

FIG. 11 is an explanatory drawing of the configuration of main wirings presented by placing the components of the control region 122 of FIG. 9 in the control region 202 of FIG. 10. In FIG. 11, reference numeral 301 denotes an address input circuit, reference numeral 302 denotes a control circuit, reference numeral 303 denotes a refresh circuit, reference numeral 304 denotes a timing generator circuit, reference numeral 305 denotes a clock generator circuit, reference numeral 306 denotes an address control signal, reference numeral 307 denotes an internal address control signal, reference numeral 308 denotes a timing adjustment signal, and reference numeral 309 denotes an internal clock signal. In FIG. 11, those connecting signals are drawn beside the circuits for purposes of illustration; however, it can be easily seen that those are implemented by forming plural wiring layers and connecting layers on the circuits laid out in actuality. Since the aspect ratio of the entire control region 122 is high as is clear from FIG. 11, the signal wirings 306 to 309 increase in length in the direction of their long side, thereby a wiring delay time lengthens and speed performance degrades. And further, although the areas of the logic circuits 301 to 305 constituting the control region 202 can be reduced with the square of the scaling law due to advanced microfabrication process, the direction of the long side is limited by the miniaturization of the memory cells because the pace of the miniaturization of the memory cells constituting the memory array region 201 is slow as compared with the pace of the miniaturization of the transistors constituting the logic circuits, and therefore the area of the semiconductor memory device cannot be optimally shrunken.

Furthermore, since there is also such a limitation on the wiring layers, the degree of freedom in their connection lowers and performance in the timings of the operations of the circuits degrades. That is, the effects of the performance of the semiconductor memory device and reducing the layout area of the semiconductor memory device are decreased, and finally the effect of reducing the production cost of the semiconductor device resulting from its miniaturization is decreased.

SUMMARY OF THE INVENTION

An object of the present invention is to provide a semiconductor memory device and a semiconductor device in which it is possible to prevent decreases in area efficiency and wiring efficiency and degradation in performance resulting from imbalances in dimensional ratios between miniaturized control circuits and other components brought by advanced microfabrication process such as a process of fabricating large-capacity DRAMs as hard macros.

From the viewpoint of the attainment of the above object, a semiconductor memory device according to a first aspect of the invention is provided with a memory array region and a control region. The memory array region is configured in such a way that the two-dimensional placement of a memory cell region in which memory cells are arranged in the form of a matrix, plural circuits which selectively point to rows and columns in the memory cell region and which read and write data from and to the memory cells selectively pointed to, and a data input/output circuit which inputs the read data and outputs the written data takes on the shape of a quadrilateral. The control region is configured in such a way that the two-dimensional placement of an address input circuit which selectively outputs an address which specifies a row and a column according to an address control signal, a control circuit which sends out the address control signal according to an external control signal, a refresh circuit which produces the address control signal instead of the external control signal during standby to effect the refresh operation of the memory cell region, a timing generator circuit which adjusts the timings of the operations of the address input circuit, the control circuit, and the refresh circuit, and a clock generator circuit which synchronizes the data input/output circuit, the address input circuit, the control circuit, the refresh circuit, and the timing generator circuit takes on the shape of a quadrilateral. The control region is connected to the memory array region with the mutually connected sides of both the regions differing in length.

By employing such a configuration, the layout areas of memories such as large-capacity DRAMs are optimized and the effect of reducing their production cost can be obtained.

That is, by taking note that having the shape of a quadrilateral is not an essential condition for the ease of the placement of large-capacity DRAMs because those DRAMs have the disadvantages that the number of the DRAMs mounted to semiconductor devices is limited and the ratio of the areas of the DRAMs to those of the semiconductor devices is high unlike ROMs and SRAMs required to come in various sizes, a large-scale DRAM can be not only fabricated with its area efficiency and wiring efficiency optimized but provided as a hard macro having a configuration easily laid out in terms of the implementation of a system LSI.

Incidentally, it is needless to say that the invention is applicable to any memories such as nonvolatile memories typified by ROMs, SRAMs, and flash memories provided that having the shape of a quadrilateral is not an essential condition for the ease of their placement in terms of their mounting to semiconductor devices as in the case of the large-capacity DRAM according to the invention.

A semiconductor memory device according to a second aspect of the invention has the configuration that the memory array region and the control region are spaced from each other in addition to the configuration described in the first aspect.

A semiconductor memory device according to a third aspect of the invention has the configuration that the memory array region and the control region are placed such that they are in contact with each other and have a convex shape when viewed from above in addition to the configuration described in the first aspect.

According to the second and third aspects of the invention, the degree of freedom in the placement of large-scale logic circuits to be placed near the control region is heightened and the ease of connections between them can be enhanced.

A semiconductor memory device according to a fourth aspect of the invention has the configuration that the control region can be placed to any place on the specified side of the memory array region in addition to the configuration described in the third aspect.

In such a configuration, the places of the control region and external data input/output lines connected to the data input/output circuit can be freely changed to places where no mutual interference occurs between them.

Semiconductor memory devices according to fifth to eighth aspects of the invention have the configuration that terminals for use in receiving external control signals are placed to at least two sides not contacting the memory array region of the control region in addition to the configuration described in any one of the first to fourth aspects.

By employing such configurations, the degree of freedom in the placement of the control region and the degree of freedom in the arrangement of wirings are heightened, and therefore the area of the device can be optimally shrunken.

Semiconductor memory devices according to ninth to twelfth aspect of the invention have the configuration that arrangement of power supply wirings for the circuits constituting the control region is the same as that of power supply wirings for the large-scale logic circuits on a substrate on which the control region is provided in addition to the configuration described in any one of the first to fourth aspects.

In such configurations, the wiring efficiency of the semiconductor device including the large-scale logic circuits is enhanced.

A semiconductor memory device according to a thirteenth aspect of the invention has the configuration that the circuits constituting the control region receive power from the large-scale logic circuit formed on the substrate on which the control region is provided in addition to the configuration described in the second aspect.

In such a configuration, the above workings are effective in the case where the memory array region and the control region are spaced from each other.

Semiconductor memory devices according to fourteenth and fifteenth aspects of the invention have the configuration that the circuits constituting the control region receive power from the memory array region in addition to the configuration described in the third or fourth aspect.

In such a configuration, the above workings are effective in the case where the memory array region and the control region are placed such that both the regions are in contact with each other.

A semiconductor memory device according to a sixteenth aspect of the invention has the configuration that the data input/output terminals of the data input/output circuit are placed to any portions other than a portion connected with the control region on the side opposite to the control region of the memory array region spaced from the control region in addition to the configuration described in the second aspect.

In such a configuration, the degree of freedom in the locations of external data input/output lines to be connected to the data input/output terminals is heightened.

Semiconductor memory devices according to seventeenth and eighteenth aspects of the invention have the configuration that the data input/output terminals of the data input/output circuit are placed to any portions other than a portion contacting the control region on the side contacting the control region of the memory array region in addition to the configuration described in the third or fourth aspect.

By employing such configurations, the same effect as that described in the sixteenth aspect can be obtained.

A semiconductor memory device according to a nineteenth aspect of the invention has the configuration that redundancy saving address data setting terminals are placed to any portions other than a portion connected to the control region on the side opposite to the control region of the memory array region spaced from the control region in addition to the configuration described in the second aspect.

In such a configuration, redundancy saving address lines for redundancy saving address storage units connected to the redundancy saving address data setting terminals shorten, thereby the ratio of the area of a wiring layer for the redundancy saving address lines to the area of the semiconductor device can be lowered.

Semiconductor memory devices according to twentieth and twenty-first aspects of the invention have the configuration that redundancy saving address data setting terminals are placed to any portions other than a portion contacting the control region on the side contacting the control region of the memory array region in addition to the configuration described in the third or fourth aspect.

By employing such configurations, the same effect as that described in the nineteenth aspect can be obtained.

Semiconductor devices according to twenty-second and twenty-third aspects of the invention have the configuration that the large-scale logic circuits formed in the substrate on which the control region is provided are placed to concave portions on both sides of the convex portion of the semiconductor memory device according to the third or fourth aspect.

In such configurations, the degree of freedom in the placement of the large-scale logic circuits to be placed near the control region is heightened and the ease of connections between them can be enhanced.

A semiconductor device according to a twenty-fourth aspect of the invention has the configuration that the redundancy saving address storage units, which are connected with the redundancy saving address data setting terminals of the semiconductor memory device according to the nineteenth aspect and provided on the substrate on which the control region is provided, are placed to the concave portions on both sides of the convex portion.

In such a configuration, since the redundancy saving address lines for the redundancy saving address storage units to be connected to the redundancy saving address data setting terminals shorten, there is less need to consider mutual interference between the redundancy saving address lines and the other lines caused by generally using shielding wires on a wiring layer whose potential is fixed to a ground potential and it becomes possible to lower the ratio of the area of a wiring layer as the redundancy saving address lines to the area of the semiconductor device.

Semiconductor memory devices according to twenty-fifth to twenty-eighth aspects of the invention have the configuration that plural memory array regions can be controlled with the control region in addition to the configuration described in any one of the first to fourth aspects.

By employing such configurations, it becomes possible to implement semiconductor devices whose area efficiency is effectively enhanced.

Semiconductor memory devices according to twenty-ninth and thirtieth aspects of the invention have the configuration that the relationship between the placement location of the control region and that of the memory array region of the semiconductor memory device according to the second or third aspect is plurally utilized such that the plural memory array regions can be controlled with the control region.

By employing such configurations, the same effect as that described in the twenty-fifth to twenty-eighth aspects can be obtained, the degree of freedom in the placement of the large-scale logic circuits to be placed near the control region is heightened, and the ease of connections between them can be enhanced.

Semiconductor memory devices according to thirty-first to thirty-third aspects of the invention have the configuration that the semiconductor memory device according to the second, third, or fourth aspect is plurally provided such that the semiconductor memory devices are desirably arranged one after the other with their desirable sides on which the data input/output circuits are not formed of the memory array regions oppositely arranged one after the other.

In such configurations, the degree of freedom in the placement of the large-scale logic circuits can be heightened and the ease of connections between the components can be enhanced.

DESCRIPTION OF THE EXEMPLARY EMBODIMENTS

Embodiments of the present invention will be described below with reference to the drawings.

A first embodiment of the invention will be described hereinbelow with reference to FIGS. 1 to 2.

Figure 1:
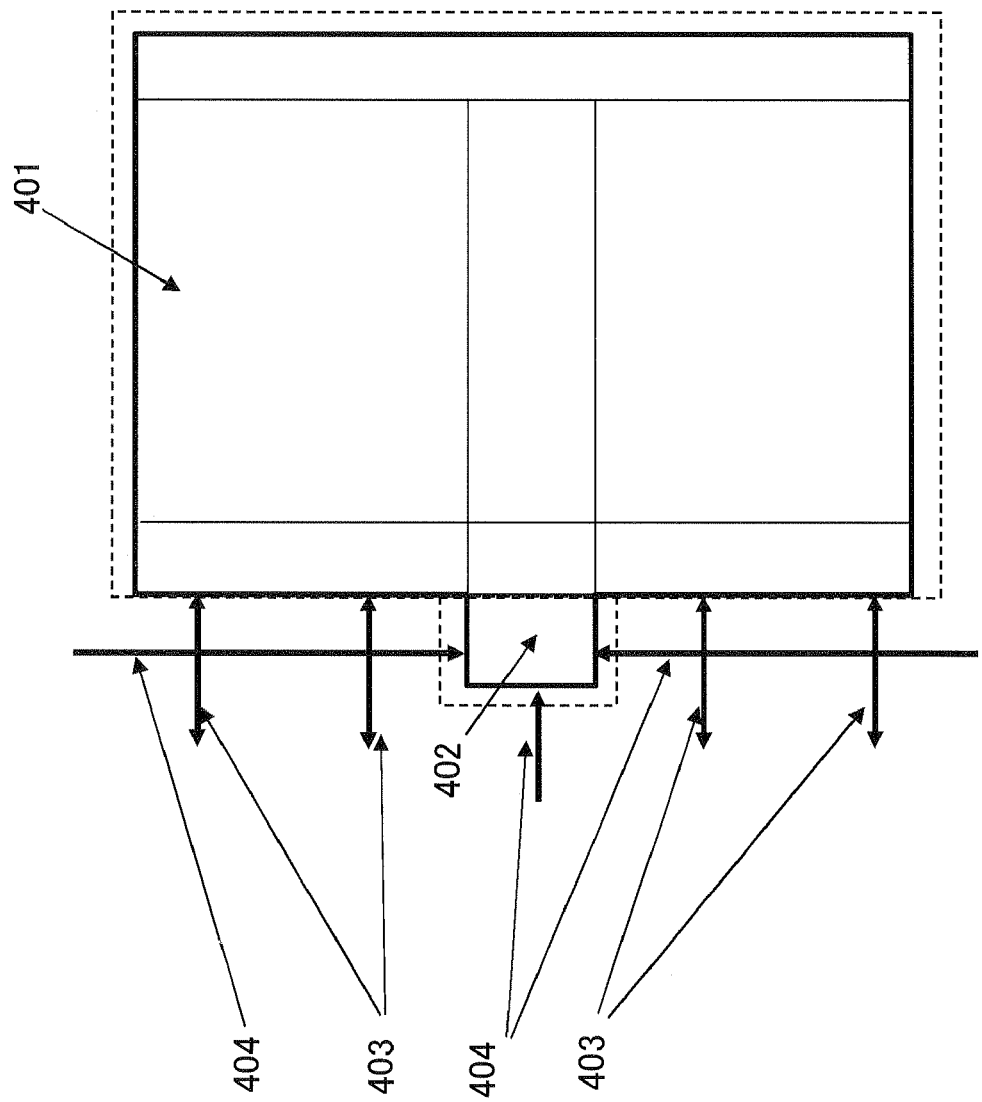
FIG. 1 is a schematic diagram of a semiconductor memory device according to a first embodiment of the present invention.

FIG. 1 is a schematic diagram of a semiconductor memory device according to the first embodiment of the invention. Incidentally, the basic circuit configuration of individual semiconductor devices presented in the embodiments described below is the same as that of FIG. 9, and the description of the configuration will not be repeated.

In FIG. 1, reference numeral 401 is a memory array region, reference numeral 402 is a control region, reference numerals 403's are external data input/output lines, and reference numerals 404's are external control signals.

The control region 402 is placed in such a way that the control region 402 itself takes on an optimum configuration without making its placement length equal to that of the memory array region 401. In this case, the memory array region 401 and the control region 402 are placed such that they are in contact with each other and have a convex shape when viewed from above. Moreover, with a data input/output circuit to which the external data input/output lines 403's are to be connected, data input/output terminals can be placed to any portions other than a portion contacting the control region 402 on the side contacting the control region 402 of the memory array region 401.

Figure 2:
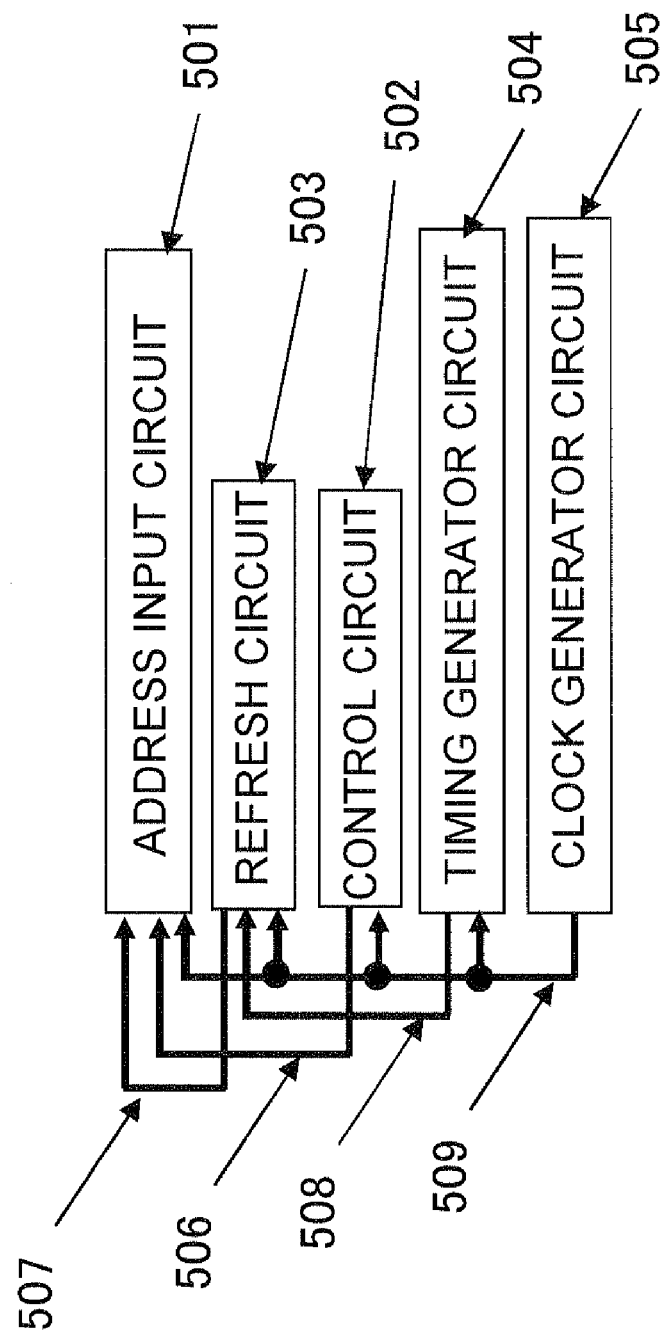
FIG. 2 is an explanatory drawing of components placed in a control region presented in the first embodiment of the invention.
Figure 9:
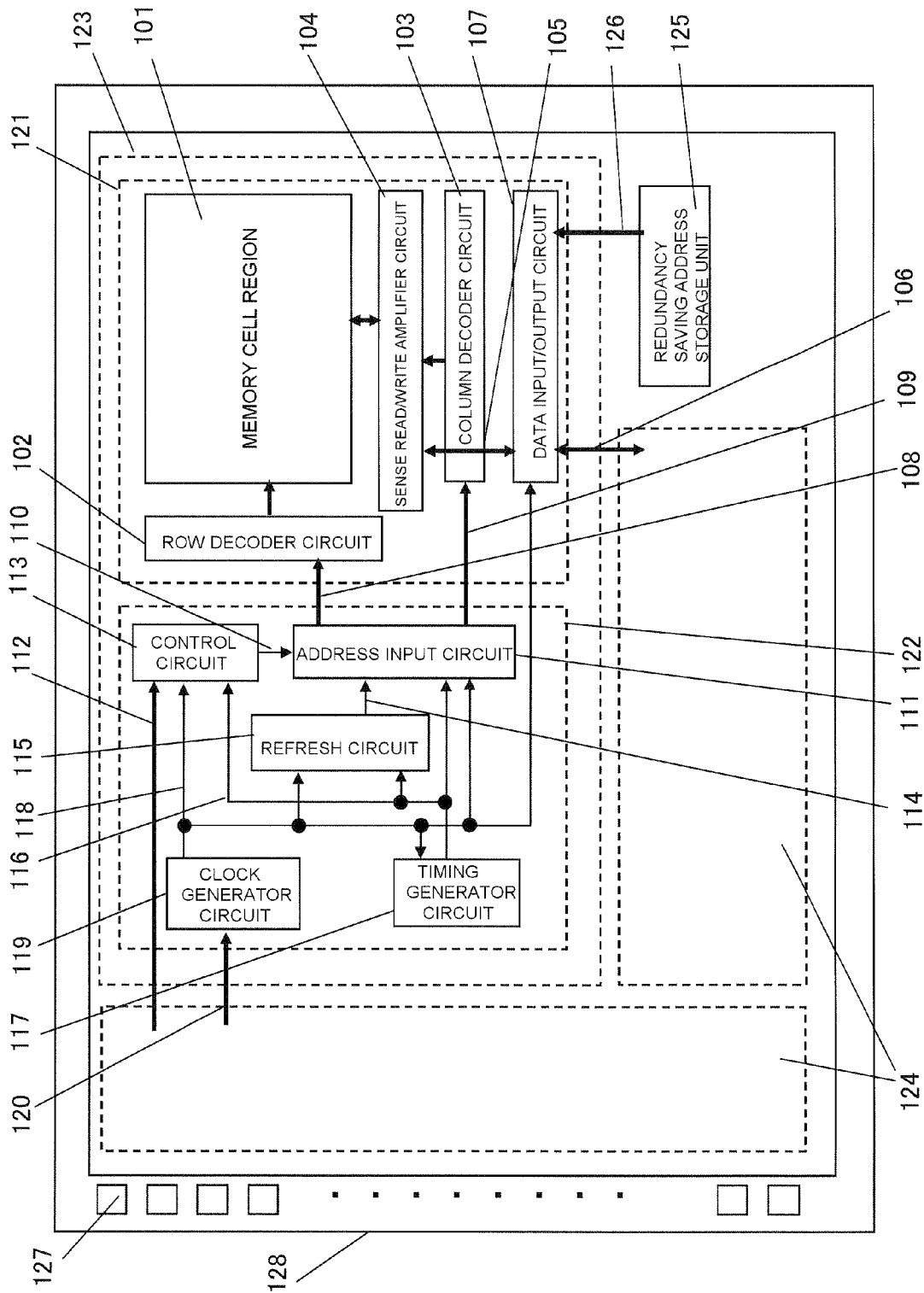
FIG. 9 is a schematic diagram of the basic circuit of a semiconductor memory device including a DRAM.
Figure 10:
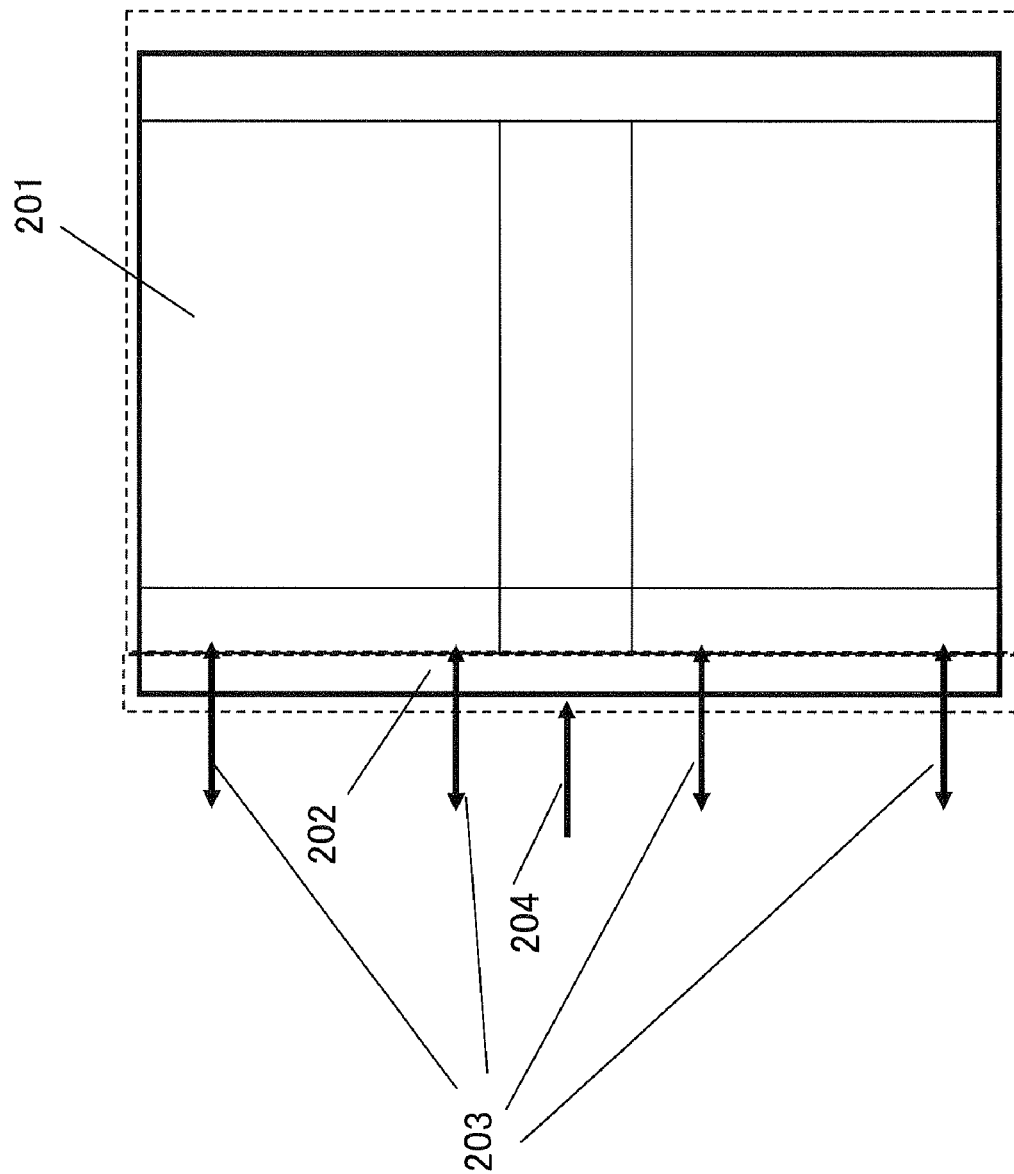
FIG. 10 is a schematic diagram of a conventional configuration of the semiconductor memory device of FIG. 9.
Figure 11:
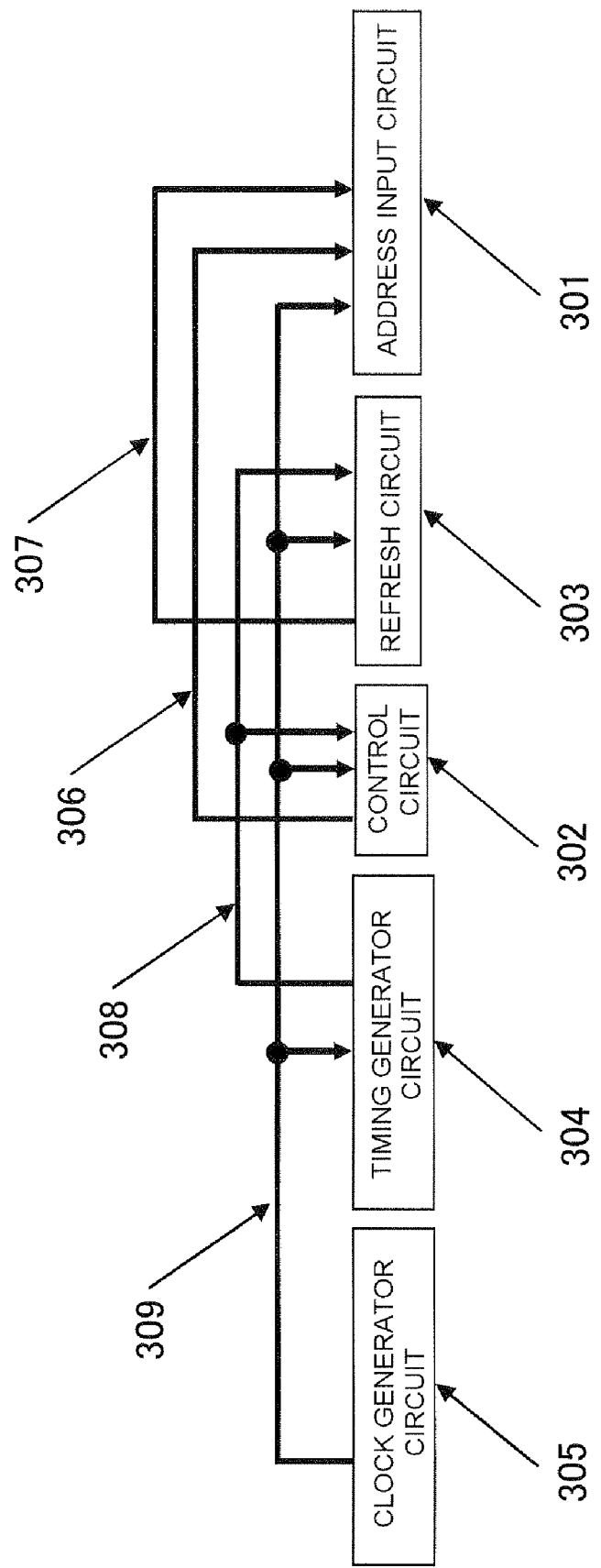
FIG. 11 is an explanatory drawing of components placed in a control region of FIG. 10.

FIG. 2 schematically shows the configuration of main wirings presented by placing the components included in the control region 122 of FIG. 9 into the control region 402 of FIG. 1. In FIG. 2, reference numeral 501 denotes an address input circuit, reference numeral 502 denotes a control circuit, reference numeral 503 denotes a refresh circuit, reference numeral 504 denotes a timing generator circuit, reference numeral 505 denotes a clock generator circuit, reference numeral 506 denotes an address control signal, reference numeral 507 denotes an internal address control signal, reference numeral 508 denotes a timing adjustment signal, and reference numeral 509 denotes an internal clock signal. Since the aspect ratio of the control region 402 is small, the wirings for use in the transmission of signals 506 to 509 are optimized and a wiring delay time is also minimized which does not cause degradation in performance. And further, although the pace at which memory cells constituting the memory array region 401 are miniaturized is slow when compared with the space at which transistors constituting the logic circuits are miniaturized, the area of the logic circuits 501 to 505 constituting the control region 402 can be shrunken with the square of the scaling law without reference to the miniaturization of the memory cells, and therefore the area of the semiconductor memory device can be optimally shrunken.

Furthermore, since external control signals 404's of FIG. 1 are transmitted to at least two sides of the control region 402, the degree of freedom in the placement of the control region 402 and the degree of freedom in the configuration of the wirings are heightened, thereby the area of the semiconductor memory device can be optimally shrunken. In the large-scale logic circuits 124's comprised of the standard cells of FIG. 9 to be connected to the control region 402 as well, the degree of freedom in the placement of the large-scale logic circuits 124's placed in the vicinity of the control region 402 including concave portions on both sides of the convex portion is heightened due to the distribution of their connected parties, which means the enhancement of the ease of connections between them.

Incidentally, the configuration of the power supply wirings for the circuits constituting the control region 402 may be the same as that of the power supply wirings for the large-scale logic circuits 124's formed on a substrate on which the control region 402 is provided. And further, power for use in driving the circuits constituting the control region 402 can be supplied from the memory array region 401. Still further, the large-scale logic circuits 124's to be formed on the substrate on which the control region 402 is provided can be placed to the concave portions on both sides of the convex portion of the semiconductor memory device.

A second embodiment of the invention will be described below with reference to FIG. 3.

Figure 3:
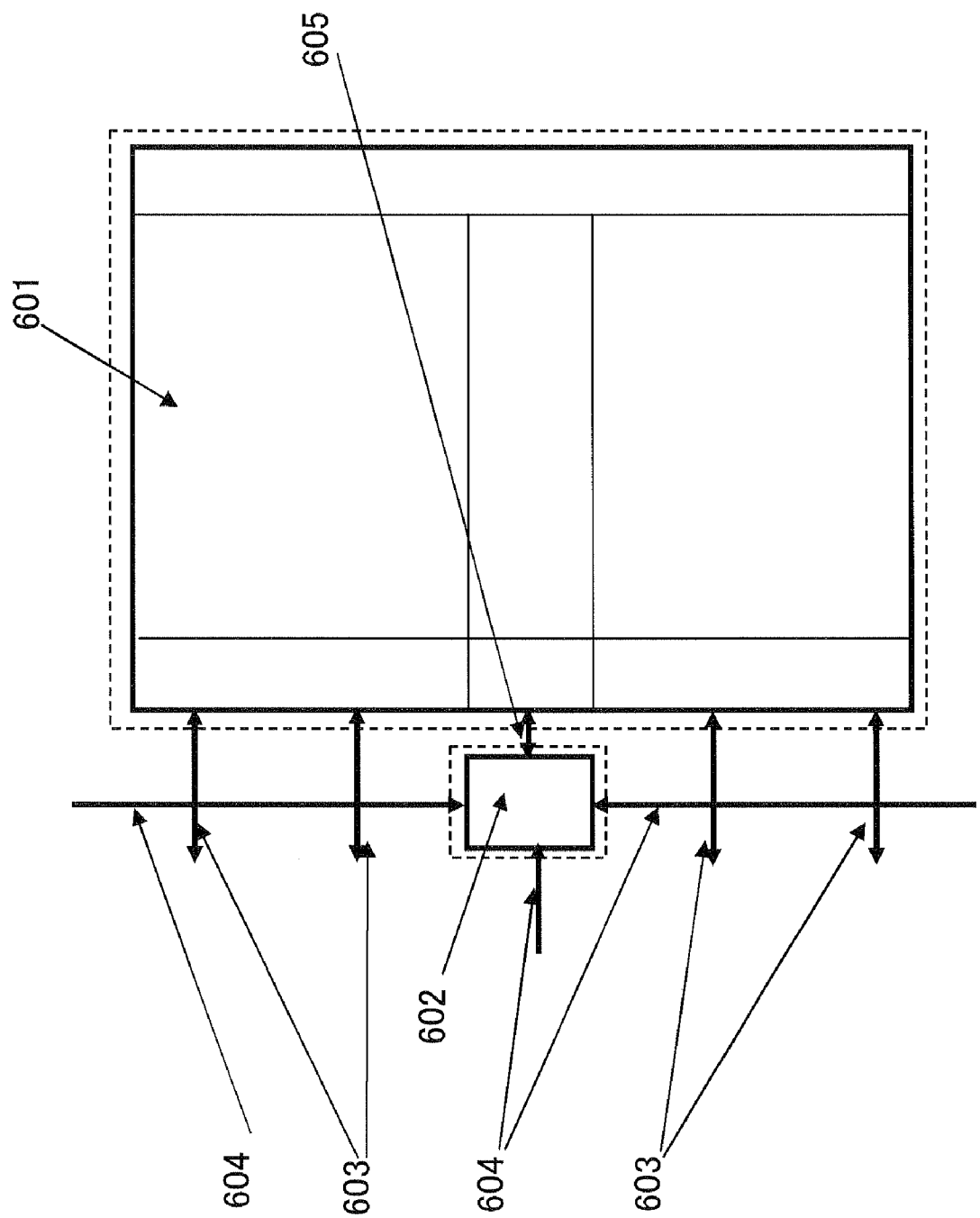
FIG. 3 is a schematic diagram of a semiconductor memory device according to a second embodiment of the invention.

FIG. 3 is a schematic diagram of a semiconductor memory device according to the second embodiment of the invention.

In FIG. 3, reference numeral 601 denotes a memory array region, reference numeral 602 denotes a control region, reference numerals 603's denote external data input/output lines, reference numerals 604's denote external control signals, and reference numeral 605 denotes a connecting line disposed between the memory array region 601 and the control region 602. The configuration of the control region 602 is the same as that of the control region 402 of FIG. 2, and the description of the configuration will not be repeated.

The control region 602 is placed in such a way that the control region 602 itself takes on the optimum configuration without making its placement length equal to that of the memory array region 601. In this case, the control region 602 is spaced from the memory array region 601. And further, with a data input/output circuit to which the external data input/output lines 603's are to be connected, data input/output terminals can be placed to any given portions other than a portion connecting with the control region 602 on the side opposite to the control region 602 of the memory array region 601 spaced from the control region 602.

Since the control region 602 can also be spaced from the memory array region 601 as described above, the degree of freedom in the placement of the large-scale logic circuits 124's comprised of the standard cells shown in FIG. 9 is heightened and the ease of the connection can be enhanced as in the case of the first embodiment.

Incidentally, power for use in driving the circuits constituting the control region 602 can be supplied from the large-scale logic circuit 124 formed on a substrate on which the control region 602 is provided.

A third embodiment of the invention will be described below with reference to FIGS. 4 and 5.

Figure 4:
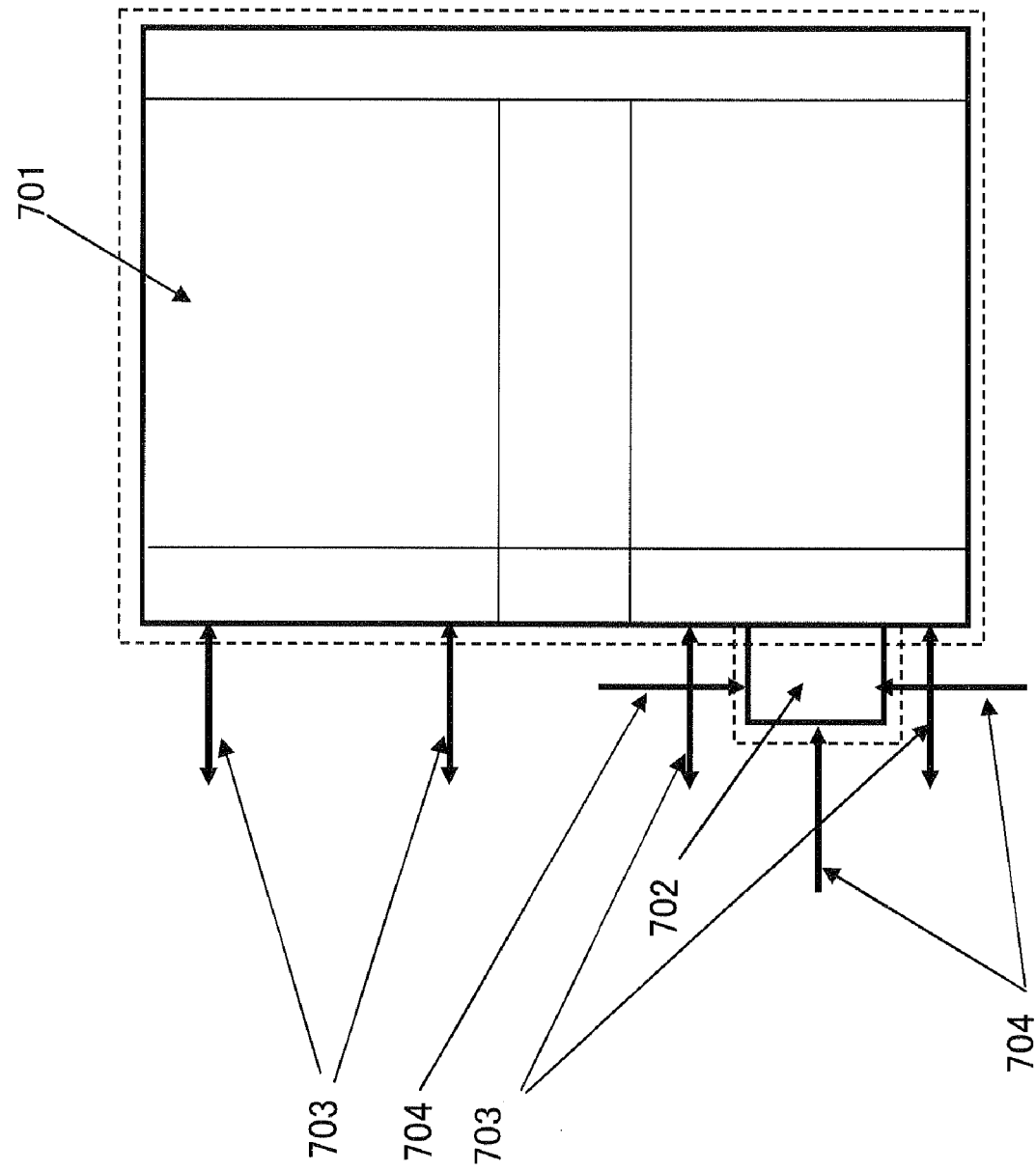
FIG. 4 is a schematic diagram of a semiconductor memory device according to a third embodiment of the invention.

FIG. 4 is a schematic diagram of a semiconductor memory device according to the third embodiment of the invention.

In FIG. 4, reference numeral 701 denotes a memory array region, reference numeral 702 denotes a control region, reference numerals 703's denote external data input/output lines, and reference numerals 704's denote external control signals. The configuration of the control region 702 is the same as that of the control region 402 of FIG. 2, and the description of the configuration will not be repeated.

The control region 702 is placed in such a way that the control region 702 itself takes on the optimum configuration without making its placement length equal to that of the memory array region 701. In this case, the control region 702 can be placed so as to be connected to any place on the specified side of the memory array region 701 in addition to the configuration of the memory device presented in the first embodiment.

Since the control region 702 can be placed so as to be connected to any place on the specified side of the memory array region 701 and the places of the external data input/output lines 703's on the specified side can be determined at will as described above, the degree of freedom in the placement of the large-scale logic circuit 124 comprised of the standard cells shown in FIG. 9 is heightened and the ease of the connection can be enhanced as in the cases of the first and second embodiments.

Figure 5:
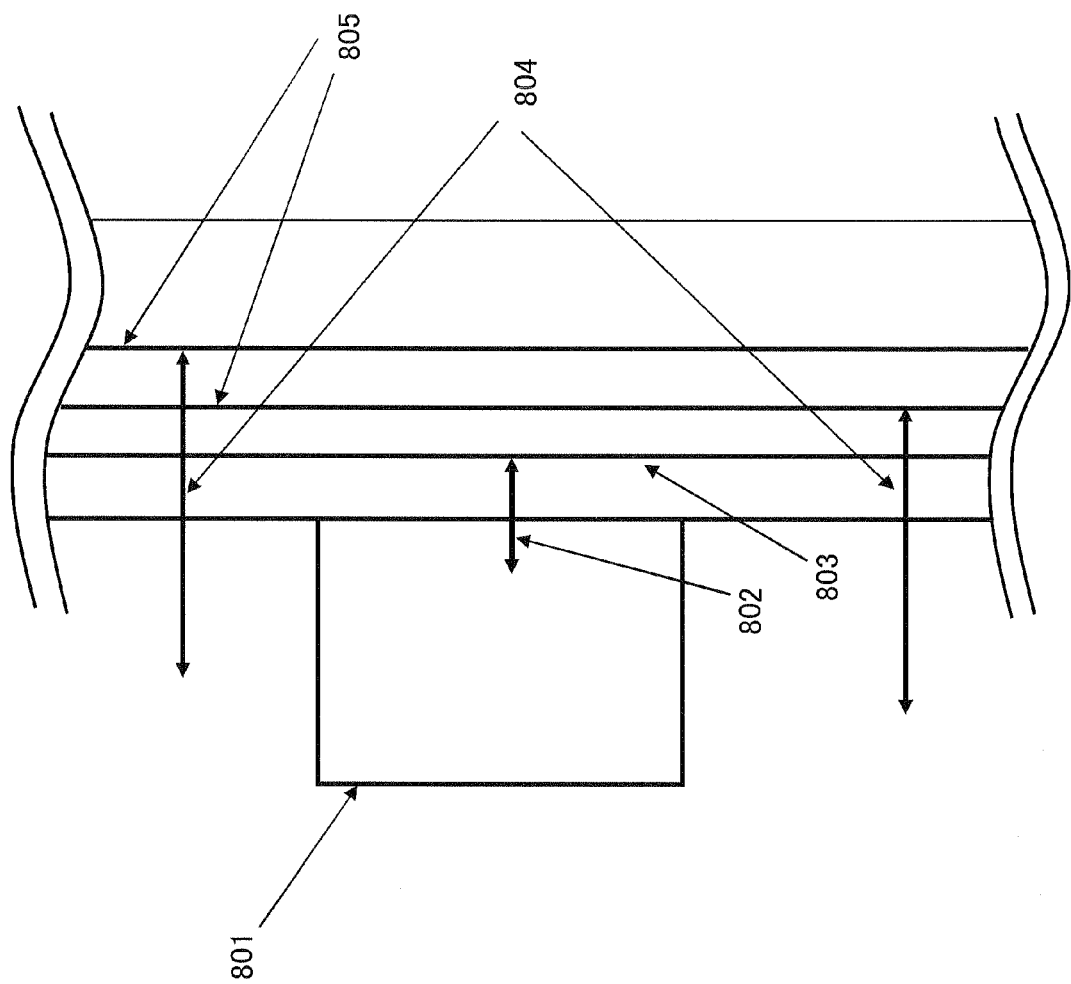
FIG. 5 is an explanatory drawing of changes in the placement locations of various lines of FIG. 4.

FIG. 5 is an explanatory drawing of changes in the placement locations of the lines of FIG. 4.

In FIG. 5, reference numeral 801 denotes a control region, reference numeral 802 denotes a connecting line for use in sending signals to the memory array region and receiving signals therefrom, reference numeral 803 denotes an internal connecting line placed in a direction perpendicular to the connecting line 802 in order to transmit signals from the connecting line 802 to the circuits in the memory array region, reference numerals 804's denote external data input/output lines, and reference numerals 805's denote internal data input/output lines placed in a direction perpendicular to the external data input/output lines 804's in order to transmit signals from the external data input/output lines 804's to the circuits in the memory array region. The connecting location of the connecting line 802 and the internal connecting line 803 and the connecting locations of the external data input/output lines 804's and the internal data input/output lines 805's can be changed at will to locations where mutual interference with the external data input/output lines 804's and the control region 801 does not occur by changing the locations of the connecting line 802 and the external data input/output lines 804's while keeping a direction perpendicular to the internal connecting line 803 and the internal data input/output lines 805's.

A fourth embodiment of the invention will be described below with reference to FIG. 6.

Figure 6:
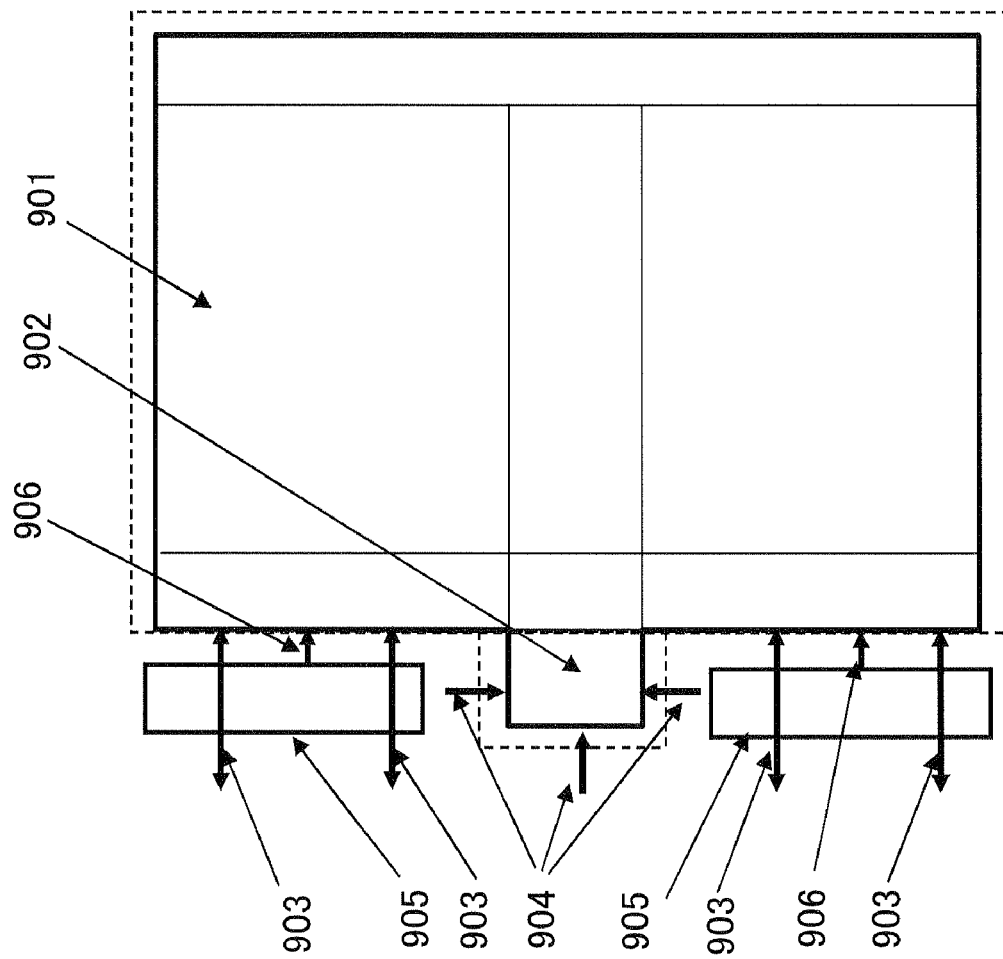
FIG. 6 is a schematic diagram of a semiconductor memory device according to a fourth embodiment of the invention.

FIG. 6 is a schematic diagram of a semiconductor memory device according to the fourth embodiment of the invention.

In FIG. 6, reference numeral 901 denotes a memory array region, reference numeral 902 denotes a control region, reference numerals 903's denote external data input/output lines, reference numerals 904's denote external control signals, reference numerals 905's denote redundancy saving address storage units, and reference numerals 906's denote redundancy saving address lines which connects the memory array region 901 and the redundancy saving address storage units 905's. The configuration of the control region 902 is the same as that of the control region 402 of FIG. 2, and the description of the configuration will not be repeated.

The control region 902 is placed in such a way that the control region 902 itself takes on the optimum configuration without making its placement length equal to that of the memory array region 901. In this case, redundancy saving address data setting terminals are placed to any given portions other than a portion contacting the control region 902 on the side contacting the control region 902 of the memory array region 901 in addition to the configuration of the memory device presented in the first embodiment. And further, both the redundancy saving address storage units 905's, which are connected to the redundancy saving address data setting terminals and which are provided on a substrate on which the control region 902 is provided, are placed to concave portions present on both sides of the convex portion of the semiconductor memory device.

Since the redundancy saving address storage units 905's are placed to the concave portions present on both sides of the convex portion formed by the memory array region 901 and the control region 902, the redundancy saving address lines 906's shorten. Therefore there is less need to consider mutual interference between the redundancy saving address lines 906's and the other signal lines caused by generally using shielding wires placed on a wiring layer whose potential is fixed to a ground potential and it becomes possible to lower the ratio of the area of a wiring layer as the redundancy saving address lines 906's to the area of the semiconductor device.

The external data input/output lines 903's and the external control signals 904's can be provided on wiring layers formed on the redundancy saving address storage units 905's, and therefore ease of connection with the large-scale logic circuits 124's comprised of the standard cells shown in FIG. 9 can be secured as in the cases of the first, second, and third embodiments.

A fifth embodiment of the invention will be described below with reference to FIG. 7.

Figure 7:
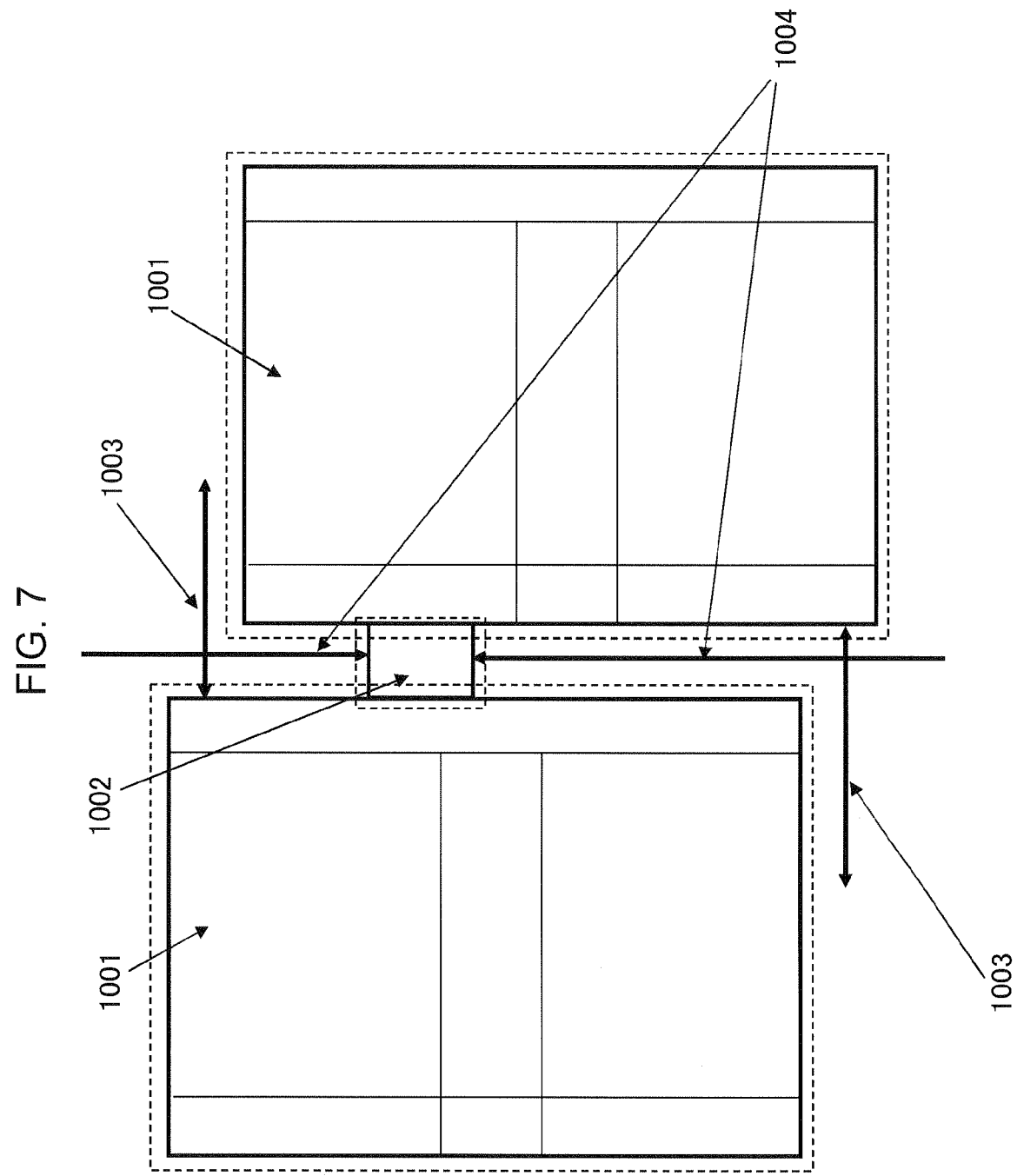
FIG. 7 is a schematic diagram of a semiconductor memory device according to a fifth embodiment of the invention.

FIG. 7 is a schematic diagram of a semiconductor memory device according to the fifth embodiment of the invention.

In FIG. 7, reference numerals 1001's denote memory array regions, reference numeral 1002 denotes a control region, reference numerals 1003's denote external data input/output lines, and reference numerals 1004's are external control signals. The basic configuration of the control region 1002 is the same as that of the control region 402 of FIG. 2 in terms of the optimization of the shape of the semiconductor memory device according to the invention to a two-dimensionally placed quadrilateral, and the description of the configuration will not be repeated.

The control region 1002 is placed in such a way that the control region 1002 itself takes on the optimum configuration without making its placement length equal to that of the memory array regions 1001's. And further, the control region 1002 is provided so as to be able to control the plural memory array regions 1001's.

Since the control region 1002 is capable of controlling the plural memory array regions 1001's as described above, it becomes possible to implement a semiconductor device whose area can be effectively utilized. And furthermore, since the positional relationship between the memory array regions 1001's and the control region 1002 can be formed by combining any one of the configurations of the memory devices according to the first, second, and third embodiments in combination, it is needless to say that the degree of freedom in the placement of the large-scale logic circuits 124's comprised of the standard cells shown in FIG. 9 is heightened and the ease of connections between the components can be enhanced as in the cases of the first, second, and third embodiments.

A sixth embodiment of the invention will be described below with reference to FIG. 8.

Figure 8:
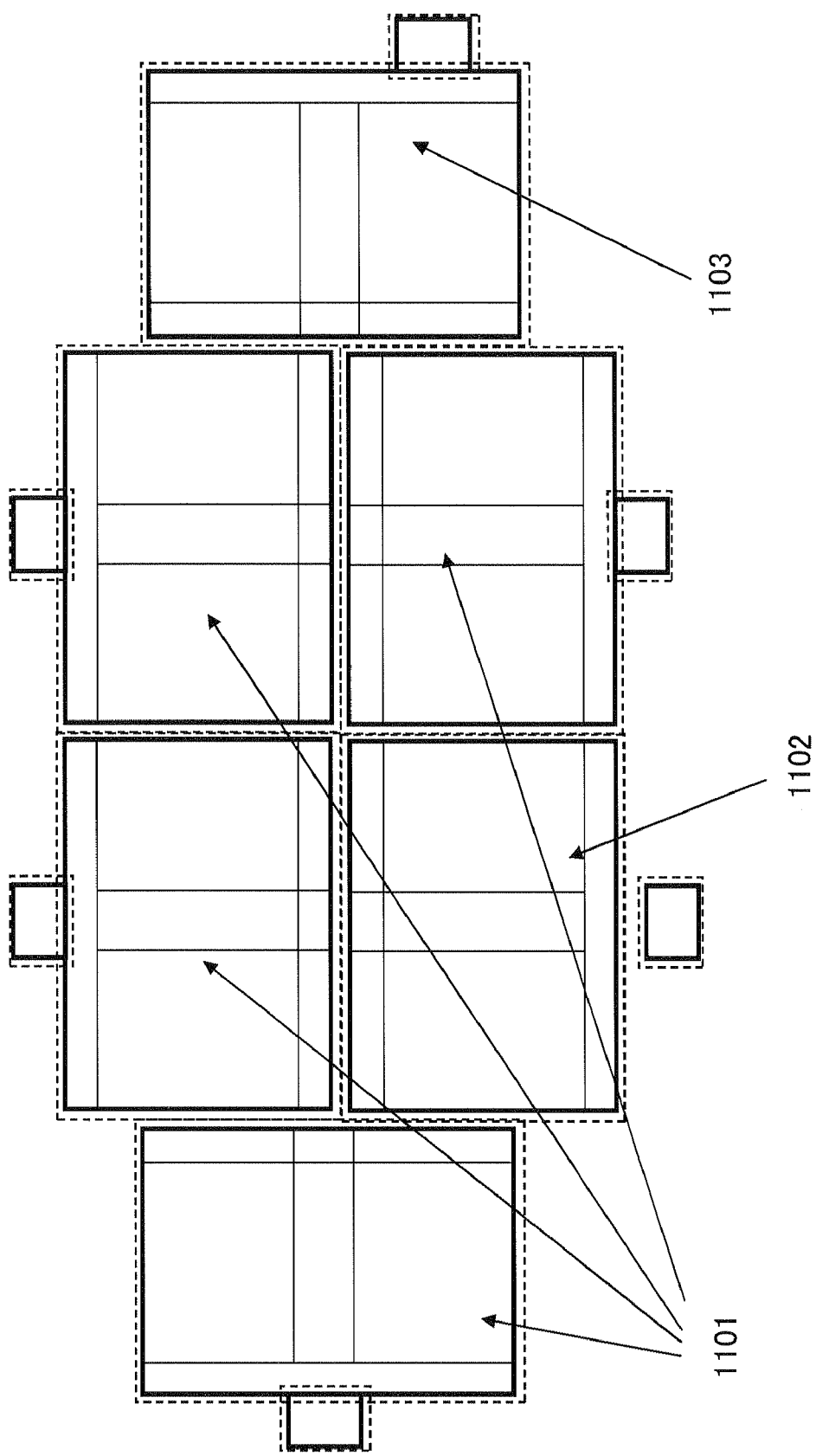
FIG. 8 is a schematic diagram of a semiconductor memory device according to a sixth embodiment of the invention.

FIG. 8 is a schematic diagram of a semiconductor memory device according to the sixth embodiment of the invention.

In FIG. 8, reference numerals 1101's denote the semiconductor memory devices of FIG. 1, reference numeral 1102 denotes the semiconductor memory device of FIG. 3, and reference numeral 1103 denotes the semiconductor memory device of FIG. 4. The description about the configuration and operation of the individual devices has already been presented and will be therefore omitted in this embodiment.

As can be seen from FIG. 8, since the plural semiconductor memory devices can be desirably arranged one after the other with the desirable sides on which the data input/output circuits are not formed of the memory array regions oppositely arranged one after the other, it is needless to say that the degree of freedom in the placement of the large-scale logic circuits comprised of the standard cells shown in FIG. 9 is heightened and the ease of connections between the components can also be enhanced as in the cases of the first, second, and third embodiments.

The invention claimed is:

1. A semiconductor memory device provided with
   a memory array region which is configured in such a way that the two-dimensional placement of a memory cell region where memory cells are arranged in the form of a matrix, plural circuits which selectively point to rows and columns in the memory cell region and which read and write data from and to the memory cells selectively pointed to, and a data input/output circuit which inputs the read data and which outputs the written data takes on the shape of a quadrilateral and
   a control region which is configured in such a way that the two-dimensional placement of an address input circuit which selectively outputs an address which specifies a row and a column according to an address control signal, a control circuit which sends out the address control signal according to an external control signal, a refresh circuit which produces the address control signal instead of the external control signal during standby to effect the refresh operation of the memory cell region, a timing generator circuit which adjusts the timings of the operations of the address input circuit, the control circuit, and the refresh circuit, and a clock generator circuit which synchronizes the data input/output circuit, the address input circuit, the control circuit, the refresh circuit, and the timing generator circuit takes on the shape of a quadrilateral, wherein
   the control region is connected to the memory array region with the mutually connected sides of both the regions differing in length.

2. The semiconductor memory device according to claim 1, wherein the memory array region and the control region are spaced from each other.

3. The semiconductor memory device according to claim 2, wherein the terminals which receive the external control signals are placed to at least two sides not contacting the memory array region of the control region.

4. The semiconductor memory device according to claim 2, wherein the configuration of power supply wirings for the circuits constituting the control region is the same as the configuration of power supply wirings for large-scale logic circuits formed on a substrate on which the control region is provided.

5. The semiconductor memory device according to claim 2, wherein the circuits constituting the control region receive power from a large-scale logic circuit formed on a substrate on which the control region is provided.

6. The semiconductor memory device according to claim 2, wherein the data input/output terminals of the data input/output circuit can be placed to any portions other than a portion connected with the control region on the side opposite to the control region of the memory array region spaced from the control region.

7. The semiconductor memory device according to claim 2, wherein redundancy saving address data setting terminals are placed to any portions other than a portion connected with the control region on the side opposite to the control region of the memory array region spaced from the control region.

8. A semiconductor device, wherein redundancy saving address storage units, which are connected to the redundancy saving address data setting terminals of the semiconductor memory device according to claim 7 and which are provided on a substrate on which the control region is provided, are placed to concave portions on both sides of the convex portion.

9. The semiconductor memory device according to claim 2, wherein the plural memory array regions can be controlled with the control region.

10. A semiconductor memory device, wherein the relationship between the placement location of the control region and that of the memory array region of the semiconductor memory device according to claim 2 is plurally utilized such that the plural memory array regions can be controlled with the control region.

11. A semiconductor memory device characterized in that the semiconductor memory device according to claim 2 is plurally provided such that the semiconductor memory devices are desirably arranged one after the other with the desirable sides on which the data input/output circuits are not formed of the memory array regions oppositely arranged one after the other.

12. The semiconductor memory device according to claim 1, wherein the memory array region and the control region are placed such that the two regions are in contact with each other and have a convex shape when viewed from above.

13. The semiconductor memory device according to claim 12, wherein the control region can be placed so as to be connected to any place on the specified side of the memory array region.

14. The semiconductor memory device according to claim 13, wherein the terminals which receive the external control signals are placed to at least two sides not contacting the memory array region of the control region.

15. The semiconductor memory device according to claim 13, wherein the configuration of power supply wirings for the circuits constituting the control region is the same as the configuration of power supply wirings for large-scale logic circuits formed on a substrate on which the control region is provided.

16. The semiconductor memory device according to claim 13, wherein the circuits constituting the control region receive power from the memory array region.

17. The semiconductor memory device according to claim 13, wherein the data input/output terminals of the data input/output circuit can be placed to any portions other than a portion contacting the control region on the side contacting the control region of the memory array region.

18. The semiconductor memory device according to claim 13, wherein redundancy saving address data setting terminals are placed to any portions other than a portion contacting the control region on the side contacting the control region of the memory array region.

19. A semiconductor device, wherein large-scale logic circuits to be formed on a substrate on which the control region is provided are placed to concave portions on both sides of the convex portion of the semiconductor memory device according to claim 13.

20. The semiconductor memory device according to claim 13, wherein the plural memory array regions can be controlled with the control region.

21. A semiconductor memory device characterized in that the semiconductor memory device according to claim 13 is plurally provided such that the semiconductor memory devices are desirably arranged one after the other with the desirable sides on which the data input/output circuits are not formed of the memory array regions oppositely arranged one after the other.

22. The semiconductor memory device according to claim 12, wherein the terminals which receive the external control signals are placed to at least two sides not contacting the memory array region of the control region.

23. The semiconductor memory device according to claim 12, wherein the configuration of power supply wirings for the circuits constituting the control region is the same as the configuration of power supply wirings for large-scale logic circuits formed on a substrate on which the control region is provided.

24. The semiconductor memory device according to claim 12, wherein the circuits constituting the control region receive power from the memory array region.

25. The semiconductor memory device according to claim 12, wherein the data input/output terminals of the data input/output circuit can be placed to any portions other than a portion contacting the control region on the side contacting the control region of the memory array region.

26. The semiconductor memory device according to claim 12, wherein redundancy saving address data setting terminals are placed to any portions other than a portion contacting the control region on the side contacting the control region of the memory array region.

27. A semiconductor device, wherein large-scale logic circuits to be formed on a substrate on which the control region is provided are placed to concave portions on both sides of the convex portion of the semiconductor memory device according to claim 12.

28. The semiconductor memory device according to claim 12, wherein the plural memory array regions can be controlled with the control region.

29. A semiconductor memory device, wherein the relationship between the placement location of the control region and that of the memory array region of the semiconductor memory device according to claim 12 is plurally utilized such that the plural memory array regions can be controlled with the control region.

30. A semiconductor memory device characterized in that the semiconductor memory device according to claim 12 is plurally provided such that the semiconductor memory devices are desirably arranged one after the other with the desirable sides on which the data input/output circuits are not formed of the memory array regions oppositely arranged one after the other.

31. The semiconductor memory device according to claim 1, wherein the terminals which receive the external control signals are placed to at least two sides not contacting the memory array region of the control region.

32. The semiconductor memory device according to claim 1, wherein the configuration of power supply wirings for the circuits constituting the control region is the same as the configuration of power supply wirings for large-scale logic circuits formed on a substrate on which the control region is provided.

33. The semiconductor memory device according to claim 1, wherein the plural memory array regions can be controlled with the control region.

* * * * *